United States Patent
Wang et al.

(10) Patent No.: US 9,733,312 B1
(45) Date of Patent: Aug. 15, 2017

(54) METHODS FOR DYNAMIC CHARACTERIZATION OF ELECTROCHEMICAL SYSTEMS

(71) Applicant: HRL Laboratories, LLC, Malibu, CA (US)

(72) Inventors: Shuoqin Wang, Oakpark, CA (US); Ping Liu, San Diego, CA (US); John Wang, Glendora, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 15/196,030

(22) Filed: Jun. 29, 2016

Related U.S. Application Data

(62) Division of application No. 13/646,663, filed on Oct. 6, 2012, now Pat. No. 9,417,290.

(51) Int. Cl.
  *G01R 31/36* (2006.01)
  *G06F 11/30* (2006.01)
(52) U.S. Cl.
  CPC ................. *G01R 31/3651* (2013.01)
(58) Field of Classification Search
  CPC .................................................. G01R 31/3651
  See application file for complete search history.

(56) References Cited

U.S. PATENT DOCUMENTS

| | | | | |
|---|---|---|---|---|
| 5,280,424 A | * | 1/1994 | Rony | B01J 19/0006 422/108 |
| 5,633,801 A | | 5/1997 | Bottman | |
| 6,339,334 B1 | * | 1/2002 | Park | G01N 27/416 324/425 |
| 7,015,701 B2 | | 3/2006 | Wiegand | |
| 7,504,835 B2 | | 3/2009 | Byington et al. | |

OTHER PUBLICATIONS

Xiao et al., "A universal state-of-charge algorithm for batteries," 47th IEEE Design Automation Conference, Anaheim, CA, 2010.
(Continued)

*Primary Examiner* — Phuong Huynh
(74) *Attorney, Agent, or Firm* — O'Connor & Company

(57) ABSTRACT

The present invention provides impulse-response-based algorithms for high-speed characterization of electrochemical systems (e.g., batteries) with good accuracy. In some variations, a method for dynamic characterization of an electrochemical system comprises selecting an electrochemical system to be characterized; sensing the measured current to or from said electrochemical system; sensing the measured voltage across said electrochemical system; sensing or calculating the time derivatives of the measured current and voltage; and calculating an impulse response using a recursive or matrix-based algorithm (as disclosed herein), wherein said impulse response characterizes said electrochemical system within a selected sampling window. The algorithms are robust, incorporating noise-reduction techniques, and are suitable for real applications under various operating conditions. These algorithms, and the apparatus and systems to implement them, are able to accept various exciting signals to provide dynamic characterization of various states of the electrochemical system.

19 Claims, 7 Drawing Sheets

(56) References Cited

OTHER PUBLICATIONS

Wang et al., "Multi-parameter battery state estimator based on the adaptive and direct solution of the governing differential equations" Journal of Power Sources 196 (2011) 8735-8741.
Kiani, "Online Detection of Faulty Battery Cells in Energy Storage Systems Via Impulse Response Method" 978-1-61284-247-9/11 2011 IEEE.

* cited by examiner

METHODS FOR DYNAMIC CHARACTERIZATION OF ELECTROCHEMICAL SYSTEMS

PRIORITY DATA

This patent application is a continuing application of U.S. patent application Ser. No. 13/646,663, filed Oct. 6, 2012 (now allowed), which is hereby incorporated by reference herein.

FIELD OF THE INVENTION

The present invention generally relates to the real-time characterization of electrochemical systems, such as batteries and fuel cells.

BACKGROUND OF THE INVENTION

An electrochemical system is a system that either derives electrical energy from chemical reactions, or facilitates chemical reactions through the introduction of electrical energy. An electrochemical system generally includes a cathode, an anode, and an electrolyte, and is typically complex with multiple heterogeneous subsystems, multiple scales from nanometers to meters. Examples of these systems include fuel cells, batteries, and electroplating systems. On-line characterization of batteries or fuel cells in vehicles is difficult, due to very rough noisy environments.

On-line characterization of such electrochemical systems is desirable in many applications, which include real-time evaluation of in-flight batteries on a satellite or aviation vehicle, and dynamic diagnostics of traction batteries for electric and hybrid-electric vehicles. In many battery-powered systems, the efficiency of batteries can be greatly enhanced by intelligent management of the electrochemical energy storage system. Management is only possible with proper diagnosis of the battery states.

Although there may be many kinds of characterization models for an electrochemical system, equivalent circuit models are most appropriate in many applications where stringent real-time requirements and limiting computing powers need to be considered. An algorithm for a circuit model is relatively simple, meaning that simulation time is short and the computation cost is relatively low. A circuit model is an empirical model that describes the electrochemical system with a resistor-capacitor (or resistor-inductor-capacitor) circuit.

In a suitable circuit model, major effects of thermodynamic and kinetic processes in the electrochemical system can be represented by circuit elements. For example, the electrode potential between the cathode and the anode of a system can be represented with a voltage source, the charge-transfer processes can be represented with charge-transfer resistances, the double-layer adsorption can be represented with capacitances, and mass-transfer or diffusion effects can be represented with resistances such as Warburg resistances. Therefore a circuit model is extremely useful for many on-line diagnostics of the real-time states of an electrochemical system.

There are several types of algorithms for a circuit model. These algorithms include parametric regression of circuit analog, Kalman filter, fuzzy logic, pattern recognition, and impedance spectroscopy. Of these algorithms, parametric regression of circuit analog and Kalman filters may have difficulties in describing non-linear parameters in an electrochemical system, such as the Warburg resistance. Fuzzy logic and pattern recognition are not reliable and practical because they are less relevant to a physical description of the system. Impedance spectroscopy is a relatively mature algorithm and is extensively used in lab equipment, but is less useful for on-line real-time characterization because it needs relatively long time (on the order of minutes).

Prior methods include those described in Xiao et al., "A universal state-of-charge algorithm for batteries," 47th IEEE Design Automation Conference, Anaheim, Calif., 2010. This paper deduces the impulse response for state of charge estimation of batteries. The model was simply a superposition of a constant voltage source and a linear circuit box characterized by an impulse response function. However, the algorithm is not robust against signal noises, and therefore is limited in on-line applications.

Other prior methods include those described in U.S. Pat. No. 7,015,701, issued to Wiegand and Sackman; U.S. Pat. No. 6,339,334, issued to Park and Yoo; U.S. Pat. No. 7,504,835, issued to Byington et al.; and U.S. Pat. No. 5,633,801, issued to Bottman. These patents describe methods to measure electrochemical impedance in the time domain. These patents disclose different time signals for exciting the detected electrochemical systems. Wiegand and Sackman disclose frequency-rich alternating current signals, Park and Yoo disclose differential delta functions, Byington et al. disclose broadband alternating current signals, and Bottman discloses short pulse signals. These patents do not disclose techniques to address data noise and other real-time, on-line challenges.

In view of the shortcomings in the art, improved algorithms for characterizing electrochemical systems are needed. These algorithms, and the apparatus and systems to implement them, preferably are able to broadly accept various exciting signals, are stable and robust against noises, and are agile for real-time use. In practical applications, noise must be addressed in order to deduce an impulse response through one or more noise-reduction techniques. The impulse response should then enable characterization of various states (beyond impedance) of the electrochemical system.

SUMMARY OF THE INVENTION

The present invention addresses the aforementioned needs in the art, as will now be summarized and then further described in detail below.

In some variations, the present invention provides a method for dynamic characterization of an electrochemical system, said method comprising:

(a) selecting an electrochemical system to be characterized at a plurality of times within a selected sampling window;

(b) providing a computer in operable communication with said electrochemical system;

(c) sensing, in said computer, a plurality of first data inputs each comprising measured current to or from said electrochemical system at said plurality of times;

(d) sensing, in said computer, a plurality of second data inputs each comprising measured voltage across said electrochemical system at said plurality of times;

(e) receiving (e.g., sensing or calculating), in said computer, a plurality of third data inputs each comprising the time derivative of said measured current at said plurality of times;

(f) receiving (e.g., sensing or calculating), in said computer, a plurality of fourth data inputs each comprising the time derivative of said measured voltage at said plurality of times; and (g) calculating an impulse response from said first, second, third, and fourth data inputs using a recursive or matrix-based algorithm, performed in said computer, wherein said impulse response characterizes said electrochemical system within said sampling window.

In some embodiments, the electrochemical system is selected from the group consisting of a battery, a fuel cell, a capacitor, an electroplating system, and a galvanic corrosion system. In certain embodiments, the electrochemical system is a battery, battery unit cell, or battery pack.

In some embodiments, step (e) includes approximating said time derivative of said measured current using a difference of said first data input at two different times. In some embodiments, step (f) includes approximating said time derivative of said measured voltage using a difference of said second data input at two different times. Steps (e) and (f) can individually or collectively accomplish high-frequency pass filtering to filter out static noises associated with said first and second data inputs.

In some embodiments, step (g) comprises solving a least-squares matrix-based equation to determine said impulse response. In these or other embodiments, step (g) comprises solving a recursive least-squares equation to determine said impulse response.

The method may include dynamically adjusting said sampling window and duration of said impulse response, to improve stability of said method and/or to accommodate kinetics (response times) associated with said electrochemical system.

In some embodiments, the method includes the step of calculating the Fourier transform of said impulse response to obtain at least one electrochemical system state, within said sampling window. In certain embodiments, the electrochemical system is a battery and at least one system state is selected from the group consisting of state-of-health, state-of-charge, state-of-power, high-frequency resistance, charge-transfer resistance, and double-layer capacitance.

Some variations of the invention provide an apparatus for dynamic characterization of an electrochemical system within a sampling window, said apparatus comprising a computer disposed in operable communication with said electrochemical system; said computer programmed with executable code for executing the steps of:

(a) sensing, in said computer, a plurality of first data inputs each comprising measured current to or from said electrochemical system at a plurality of times;

(b) sensing, in said computer, a plurality of second data inputs each comprising measured voltage across said electrochemical system at said plurality of times;

(c) receiving (e.g., sensing or calculating), in said computer, a plurality of third data inputs each comprising the time derivative of said measured current at said plurality of times;

(d) receiving (e.g., sensing or calculating), in said computer, a plurality of fourth data inputs each comprising the time derivative of said measured voltage at said plurality of times; and (e) calculating an impulse response from said first, second, third, and fourth data inputs using a recursive or matrix-based algorithm, wherein said impulse response characterizes said electrochemical system within said sampling window.

The electrochemical system may be selected from the group consisting of (but not limited to) a battery, a fuel cell, a capacitor, an electroplating system, and a galvanic corrosion system. The electrochemical system is or includes a battery, in some embodiments.

In some embodiments, the computer is programmed to solve a least-squares matrix-based equation to determine said impulse response. In these or other embodiments, the computer is programmed to solve a recursive least-squares equation to determine said impulse response.

In some embodiments, the computer is programmed to filter out static noises associated with said first and second data inputs. The computer may be programmed to dynamically adjust said sampling window and duration of said impulse response, to improve stability of said characterization or to accommodate kinetics associated with said electrochemical system.

The computer may be further programmed to calculate the Fourier transform of said impulse response to obtain at least one electrochemical system state, within said sampling window. Electrochemical system states include, but are not limited to, state-of-charge, state-of-power, state-of-health, high-frequency resistance, charge-transfer resistance, and double-layer capacitance.

This invention additionally provides a system comprising a battery that is electronically connected to an apparatus for dynamic characterization of said battery within a sampling window, said apparatus comprising a computer disposed in operable communication with said battery; said computer programmed with executable code for executing the steps of:

(a) sensing, in said computer, a plurality of first data inputs each comprising measured current to or from said battery at a plurality of times;

(b) sensing, in said computer, a plurality of second data inputs each comprising measured voltage across said battery at said plurality of times;

(c) receiving (e.g., sensing or calculating), in said computer, a plurality of third data inputs each comprising the time derivative of said measured current at said plurality of times;

(d) receiving (e.g., sensing or calculating), in said computer, a plurality of fourth data inputs each comprising the time derivative of said measured voltage at said plurality of times; and (e) calculating an impulse response from said first, second, third, and fourth data inputs using a recursive or matrix-based algorithm, wherein said impulse response characterizes said battery within said sampling window.

Such a system may be structurally connected with, or placed in electrical communication with, a variety of devices, vehicles, or other systems using a battery. For example, in some embodiments a satellite, aircraft, or drone is configured with such a system. In some embodiments, an electric vehicle or hybrid electric vehicle is configured with such a system. Stationary power stations and personal power packs are other examples of overall systems that may incorporate the system of the invention.

DETAILED DESCRIPTION OF EMBODIMENTS OF THE INVENTION

Figure 1:
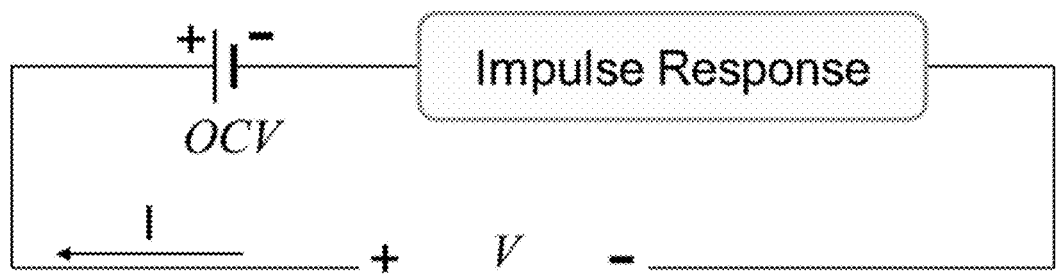
FIG. 1 is a schematic of a circuit model for a general electrochemical system, in some embodiments of the invention.

The methods, apparatus, and systems of the present invention will be described in detail by reference to various non-limiting embodiments and figures.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs. As intended herein, "receiving" shall be broadly construed as including "providing," "sensing" (e.g., using a sensor attached to a computer), "calculating" (e.g., using executable code in a computer), and so on.

Unless otherwise indicated, all numbers expressing parameters, conditions, results, and so forth used in the specification and claims are to be understood as being modified in all instances by the term "about." Accordingly, unless indicated to the contrary, the numbers set forth in the following specification and attached claims are approximations that may vary depending upon specific algorithms and calculations.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

Some variations of this invention provide an impulse-response-based algorithm for on-line characterization of an electrochemical system. An algorithm as provided herein may utilize measured current (I) and/or voltage (V) signals to directly extract thermodynamic and kinetic information associated with the electrochemical system, dynamically (in real time). The impulse-response-based algorithms of the present invention can provide high-speed characterization of an electrochemical system with improved accuracy. The algorithms are robust and suitable for real environment applications under various operating conditions.

The algorithms work in the time domain without relying on frequency-domain transformations. Therefore, these methods are more aligned for real-time applications. By avoiding frequency-domain transformations, the algorithms provided herein, in some embodiments, can surprisingly regress the results 1-2 orders of magnitudes faster compared to prior methods.

In addition, the disclosed impulse-response-based algorithms provide broader capabilities in characterizing an electrochemical system by prescribing an impulse-response function. Circuit models employing conventional circuit elements can have difficulty describing some kinetic processes. In particular, the methods herein explicitly account for time-domain diffusion phenomena.

Generally speaking, any system having an anode and a cathode; any system that supplies, receives, or is in electrical communication with a current and a voltage source or signal; or any system capable of being characterized utilizing the principles described herein, may be an "electrochemical system" within the intended meaning. Electrochemical systems that may be characterized using these impulse-response-based algorithms include, but are by no means limited to, batteries, fuel cells, capacitors, ultracapacitors, hybrid combustion-electric systems, and other energy-delivery or energy-storage devices.

Electrochemical systems include not only systems intended to provide energy or store energy, but also systems that utilize electrochemical reactions to carry out chemistry or separations of matter. Such electrochemistry applications include electroplating and galvanic corrosion for carrying out chemical reactions, and electrochemical separators for separations of matter. Electrochemical separators include electrochemical membranes and electrostatic precipitators, for example.

When the electrochemical system is a battery, the impulse-response-based algorithm enables one to accurately estimate the battery states under dynamic operating conditions. Battery states include, but are not limited to, state-of-health, state-of-charge, state-of-power, high-frequency resistance, charge-transfer resistance, and double-layer capacitance. State-of-health is a figure of merit of the condition of a battery (or a cell, or a battery pack), compared to its ideal conditions. State-of-charge is an indication of how much useful energy remains in the battery. State-of-power characterizes the charge and discharge power capabilities of the battery. High-frequency resistance, charge-transfer resistance, and double-layer capacitance characterize the actual kinetic processes that take place in the battery, including both electrochemical reactions as well as mass transport and diffusion processes.

Some variations of the invention provide methods for dynamic characterization of an electrochemical system, the method comprising:

(a) selecting an electrochemical system to be characterized at a plurality of times within a selected sampling window;

(b) providing a computer in operable communication with the electrochemical system;

(c) sensing, in the computer, a plurality of first data inputs each comprising measured current to or from the electrochemical system at the plurality of times;

(d) sensing, in the computer, a plurality of second data inputs each comprising measured voltage across the electrochemical system at the plurality of times;

(e) receiving (e.g., sensing or calculating), in the computer, a plurality of third data inputs each comprising the time derivative of the measured current at the plurality of times;

(f) receiving (e.g., sensing or calculating), in the computer, a plurality of fourth data inputs each comprising the time derivative of the measured voltage at the plurality of times; and (g) calculating an impulse response from the first, second, third, and fourth data inputs using a recursive or matrix-based algorithm, performed in the computer, wherein the impulse response characterizes the electrochemical system within the sampling window.

In order for the model to be robust against noises and be agile enough for real-time use, an algorithm is employed that calculates or estimates an impulse response. In the algorithm, the impulse response of the system is deduced with the current and voltage samples of a battery in a selected time window. A moving-window technique may be employed to update the algorithm recursively. The sizes of the impulse response and the window can be adjusted to accommodate the bandwidth of the kinetic process of the system. Once the impulse repulse is deduced at real time, states of the electrochemical system can be derived based on the impulse repulse.

In some embodiments, the algorithm implements noise-filtering techniques which enable stable regression in the algorithm in the presence of noise (e.g., due to electromagnetic interference). Such noise reduction methods also improve the accuracy and reliability of the regressed parameters. Various types of noise in the current and/or voltage data may be present, including high-frequency noise.

In some embodiments, a high-frequency pass filter is used for filtering out static noises associated with current and voltage measurements. A high-frequency pass filter is an electronic filter that passes high-frequency signals but attenuates signals with frequencies lower than the cutoff frequency. High-frequency pass filtering to remove at least some static noises may be helpful in improving the stability of the algorithm.

In some embodiments, a least-squares regression method is implemented for improving the stability of the algorithm against high-frequency noises. Least-squares regression utilizes methods such as, but not limited to, linear least squares, non-linear least squares, partial least squares, sparse partial least squares, weighted least squares, least squares with penalty function, and combinations thereof.

The linear least-squares fitting technique is a convenient form of linear regression. For non-linear least squares fitting to a number of unknown parameters, linear least squares fitting may be applied iteratively to a linearized form of the function until convergence is achieved. It is also possible to linearize a non-linear function at the outset and still use linear methods for determining fit parameters. If uncertainties are known or estimated, points can be weighted differently in order to give the high-quality points more weight, if desired.

A schematic of a circuit model for a general electrochemical system is shown in FIG. 1. The total voltage response of a circuit can be formulated as the superposition of the zero-state response (ZSR) and the zero-input response (ZIR). The ZSR results only from the external inputs of driving currents of the circuit; the ZIR results only from the initial state of the circuit and not from any external drive. For an electrochemical system such as a battery, the ZIR is the open-circuit voltage (OCV) source if the battery has been open circuit for a sufficient time, ignoring self-discharge, to reach an equilibrium state. The ZSR can be calculated as the convolution of the driving currents with an impulse response characterizing the system.

The equation of a voltage response of an electrochemical system such as a battery can thus be written as:

$$V(t) = OCV(t) + \int_0^\infty I(t-\tau) H(\tau) d\tau \quad \text{(EQ. 1)}$$

In EQ. 1, V(t) and I(t) are the measured voltage and current values as a function of time. H(t) is the impulse response. In defining the integration range from 0 to ∞, we have complied with the causality that the real-time response is only caused by the inputs at the current time and the time before.

It is assumed that the impulse response converges to zero after finite time $T_o$, i.e., H(t)=0, as t>$T_o$. It is a reasonable approximation for many electrochemical systems, and EQ. 1 is modified as:

$$V(t) = OCV(t) + \int_0^{T_o} I(t-\tau) H(\tau) d\tau \quad \text{(EQ. 2)}$$

Further modification is made by differentiating the two sides of the EQ. 2 with time. Differentiating data is equivalent to high-pass filtering for removing static noises which, as the present inventors have discovered, can improve the stability of the algorithm. Moreover, we assume $$\frac{dV(t)}{dt} \gg \frac{dOCV(t)}{dt},$$

which is reasonable as long as there are finite current inputs. The result is EQ. 3:

$$\frac{dV(t)}{dt} = \int_0^{T_o} \frac{dI(t-\tau)}{dt} H(\tau) d\tau \quad \text{(EQ. 3)}$$

EQ. 3 is the main equation relied upon to solve the impulse response H(t), in some embodiments. However, EQ. 3 is not an explicit formula for H(t).

Figure 4:
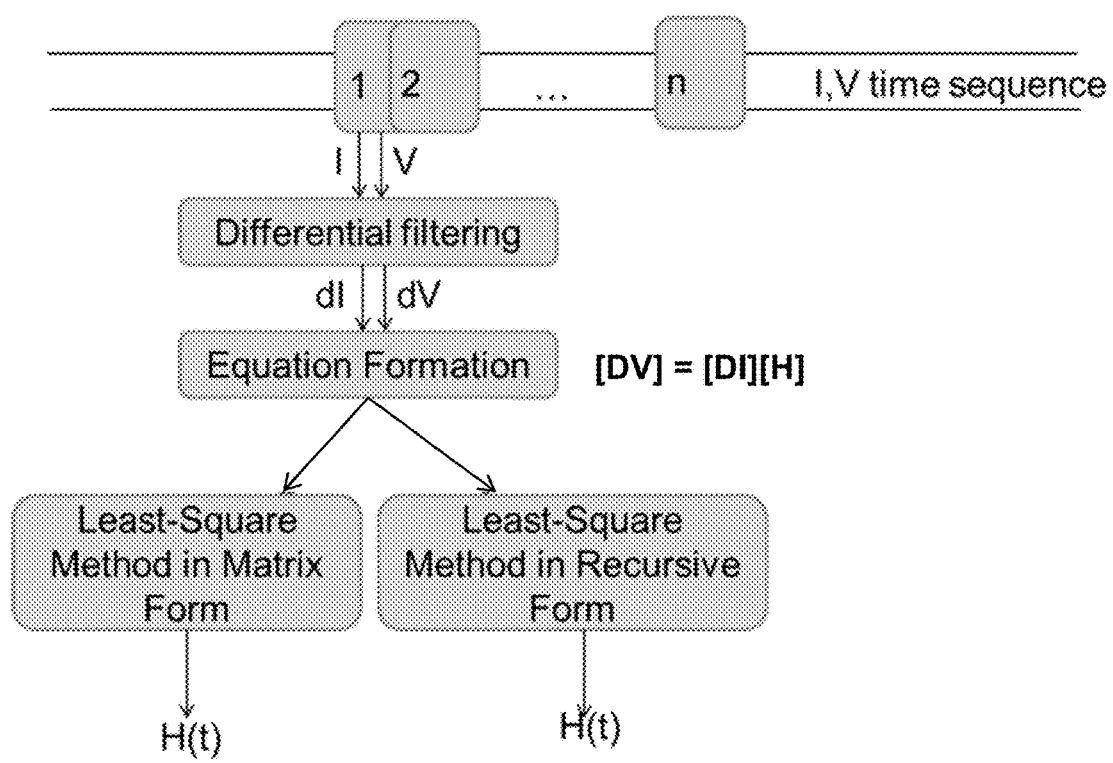
FIG. 4 is a depiction of the method workflow in some embodiments.

The desired impulse response H(t) needs to be obtained by deconvolution from EQ. 3. A workflow of solving H(t) is illustrated in FIG. 4, which depicts an exemplary method of the invention. EQ. 3 can be digitized, since evaluation is carried out at the sampling instants with T as the sampling interval. The digitized formula becomes EQ. 4:

$$[DV] = [DI] \cdot [H] \quad \text{(EQ. 4)}$$

with $$[DV] = [V_{N+1} - V_N, V_{N+2} - V_{N+1}, \ldots, V_{N+M} - V_{N+M-1}]^T$$

$$[DI] = \begin{bmatrix} I_{N+1} - I_N & I_N - I_{N-1} & \ldots & I_2 - I_1 \\ I_{N+2} - I_{N+1} & I_{N+1} - I_N & \ldots & I_3 - I_2 \\ \ldots & \ldots & \ldots & \ldots \\ I_{N+M} - I_{N+M-1} & I_{N+M-1} - I_{N+M-2} & \ldots & I_{M+1} - I_M \end{bmatrix}$$

$$[H] = [H_0, H_1, \ldots, H_{N-1}]^T.$$

The subscripts in the EQ. 4 represent the sampling coefficients. In some embodiments, N can be chosen so that $N \approx T_0/T$. H(t) is evaluated at $t=0, T, 2T, \ldots, (N-1)T$ and it is assumed that $H(t)=0$ for $t \geq T_0 = NT$. The sum of N and M defines the size of the temporal window, $\Delta t = (N+M)T$, in which the sampled V(t) and I(t) will be used to fill in the matrices of [DV] and [DI]. In these embodiments the sizes of the matrices [DV], [DI], and [H] are M×1, M×N, and N×1, respectively, which means that M≥N is the necessary condition for the valid solution of H(t).

With respect to EQS. 3 and 4, there are essentially always noises in the V(t) and I(t) data which are not explicitly expressed. In order to improve the stability of the algorithm against such noises, a least-squares method may be utilized to solve [H]. In the form of matrices, the solution is given by EQ. 5:

$$[H] = ([DI]^T [DI])^{-1} [DI]^T [DV] \quad \text{(EQ. 5)}$$

A valid solution to EQ. 5 for [H] can be acquired as long as the matrix product $[G]=[DI]^T[DT]$ is nonsingular. The rank of [G] provides an estimate of the number of linearly independent rows or columns of [G], at given points in time. There are a number of ways to compute the rank. In some embodiments, singular value decomposition is employed.

In some embodiments, recursive algorithms are utilized wherein all information utilized stems from previous time-step calculations and measurements at the present time-steps. Optionally, a moving-window technique may be employed to update the algorithm recursively. The sizes of the impulse response and the window can be adjusted to accommodate the bandwidth of the kinetics of the selected electrochemical system (e.g., a battery or fuel cell).

There are several methods to dictate the adjustment of the size of the sampling window. One method is to adjust the size based on the knowledge of the thermodynamics and kinetics of the electrochemical system. If the system has a more sluggish kinetic response, the window may be increased, and vice versa. The response time is different for different electrochemical systems. Also the response time is generally different for a given system at different times.

Another method dictate the adjustment of the size of the sampling window is based on mathematics. The size of the window can be increased at first, and the result of the impulse response H(t) can be used to compare with the H(t) with the original window size. If H(t) changes significantly, the sampling window size may be increased. If H(t) does not change significantly, the size of the window is deemed to be wide enough.

Due to the limitations of computer storage and constraints of embedded controllers, recursive algorithms may be preferred, in some embodiments. Using recursive algorithms, all information that is utilized at a given time-step derives from previous time-step calculations along with measurements at the present time-step. The following equations apply to recursive algorithms.

From EQ. 5, the recursive form can be derived as EQ. 6:

$$\sum_{i=0}^{N-1} H_i \sum_{j=0}^{M-1} DI_{jl} DI_{ji} = \sum_{j=0}^{M-1} DI_{jl} DV_j \quad \text{(EQ. 6)}$$

where $$DI_{ij} = I_{N+i-j+1} - I_{N+i-j},$$

$$DV_i = V_{N+i+1} - V_{N+i}.$$

Each element of the impulse response [H] can be expressed as $$H_l = \frac{X_l - \sum_{i=0, i \neq l}^{N} H_i Y_{il}}{Z_l} = \frac{\sum_{j=0}^{M-1} DI_{jl} DV_j - \sum_{i=0, i \neq l}^{N} H_i \sum_{j=0}^{M-1} DI_{jl} D_{ji}}{\sum_{j=0}^{M-1} DI_{jl}^2} \quad \text{(EQ. 7)}$$

The $X_i$, $Y_{ij}$, $Z_i$ with i, j=0, 1, N are updated with the following recursive equations:
For i=1, 2, 3, . . . , N−1, $$X_i^t = X_{i-1}^{t-1}$$

$$Y_{iL}^t = T_{i-1,L-1}^{t-1}$$

$$Y_{Li}^t = Y_{iL}^t, L = 1, 2, \ldots N$$

$$Z_i^t = Z_{i-1}^{t-1}$$

For i=0, $$X_0^t = X_0^{t-1} + (I_{N+M+1} - I_{N+M})(V_{N+M+1} - V_{N+M}) - (I_{N+1} - I_N)(V_{N+1} - V_N)$$

$$Y_{0L}^t = Y_{0L}^{t-1} + (I_{N+M+1} - I_{N+M})(I_{N+M-L} - V_{N+M-L-1}) - (I_{N+1} - I_N)(V_{N-L+1} - V_{N-L}),$$

$$Y_{L0}^t = Y_{0L}^t$$

$$L = 1, 2, \ldots N$$

$$Z_0^t = Z_0^{t-1} + (I_{N+M+1} - I_{N+M})^2 - (I_{N+1} - I_N)^2$$

In calculating each $H_i$(i=0, 1, 2, . . . , N−1) at the current time with EQ. 7, the most-updated H elements are used on the right-hand side of the equation.

The Fourier transform of the impulse response H(t) represents the impedance spectroscopy. "Impedance spectroscopy" generally refers to signal measurement of the linear electrical response and subsequent analysis of the response to yield useful information about the physicochemical properties of a system (see Examples herein). From the impedance spectroscopy, state-of-health, state-of-charge, and state-of-power may be monitored.

Specifically, the impedance at high frequency may be used as an indicator for state-of-health. The reason is that most the impedance of typical batteries increases with age. This high-frequency impedance can be directly read out from the spectrum. State-of-charge may be deduced with the open circuit voltage via a voltage-state-of-charge look-up table. The open circuit voltage is a thermodynamic parameter which can be derived if the kinetic response of the system is known. State-of-power is the current response to the maximum/minimum voltage input. Therefore, it can be calculated with the convolution of the voltage and the impulse response.

In certain embodiments, additional data inputs (beyond current and voltage) are considered in the model and algorithms. Additional data inputs may relate to ambient conditions of the local environment, including temperature, pressure, relative humidity, and electromagnetic interference patterns, for instance. Additional data inputs may be based on previous experience with similar devices, or other ways to capture prior knowledge to improve the accuracy of the diagnostics for the intended purpose. These additional data inputs may be quantitative or qualitative in nature.

The above-described methods may be implemented in a suitable physical apparatus. In some variations, the invention provides an apparatus for dynamic characterization of an electrochemical system within a sampling window, the apparatus comprising a computer disposed in operable communication with the electrochemical system; the computer programmed with executable code for executing the steps of:

(a) sensing, in the computer, a plurality of first data inputs each comprising measured current to or from the electrochemical system at a plurality of times;

(b) sensing, in the computer, a plurality of second data inputs each comprising measured voltage across the electrochemical system at the plurality of times;

(c) sensing or calculating, in the computer, a plurality of third data inputs each comprising the time derivative of the measured current at the plurality of times;

(d) sensing or calculating, in the computer, a plurality of fourth data inputs each comprising the time derivative of the measured voltage at the plurality of times; and (e) calculating an impulse response from the first, second, third, and fourth data inputs using a recursive or matrix-based algorithm, wherein the impulse response characterizes the electrochemical system within the sampling window.

The apparatus can be understood, in some embodiments, by reference to FIG. 4 wherein the first data inputs form the current (I in the figure) time sequence, the second data inputs form the voltage (V in the figure) time sequence, the third data inputs are the differential current data (dI in the figure), the fourth data inputs are the differential voltage data (dV in the figure), and the equation [DV]=[DI][H] is solved in the computer to calculate an impulse response H(t) from the first, second, third, and fourth data inputs using matrix-based calculations (lower-left part of FIG. 4) or recursive calculations (lower-right part of FIG. 4), or optionally some combination thereof.

The "computer" utilized in the apparatus is any programmable computing device, or plurality of devices which may be distributed in time or space, capable of being programmed (such as using C++ programming language) or otherwise caused to execute code for executing the steps of any of the methods or algorithms described herein. The algorithm may be embedded within a controller.

In some embodiments, the computer has a processor, an area of main memory for executing program code under the direction of the processor, a storage device for storing data and program code and a bus connecting the processor, main memory, and the storage device; the code being stored in the storage device and executing in the main non-transient memory under the direction of the processor, to perform the steps of the methods or algorithms recited in this description. Optionally, the computer may be configured to exchange data with a network (such as the Internet), and may carry out calculations on remote computers, servers, or via cloud computing.

Figure 5:
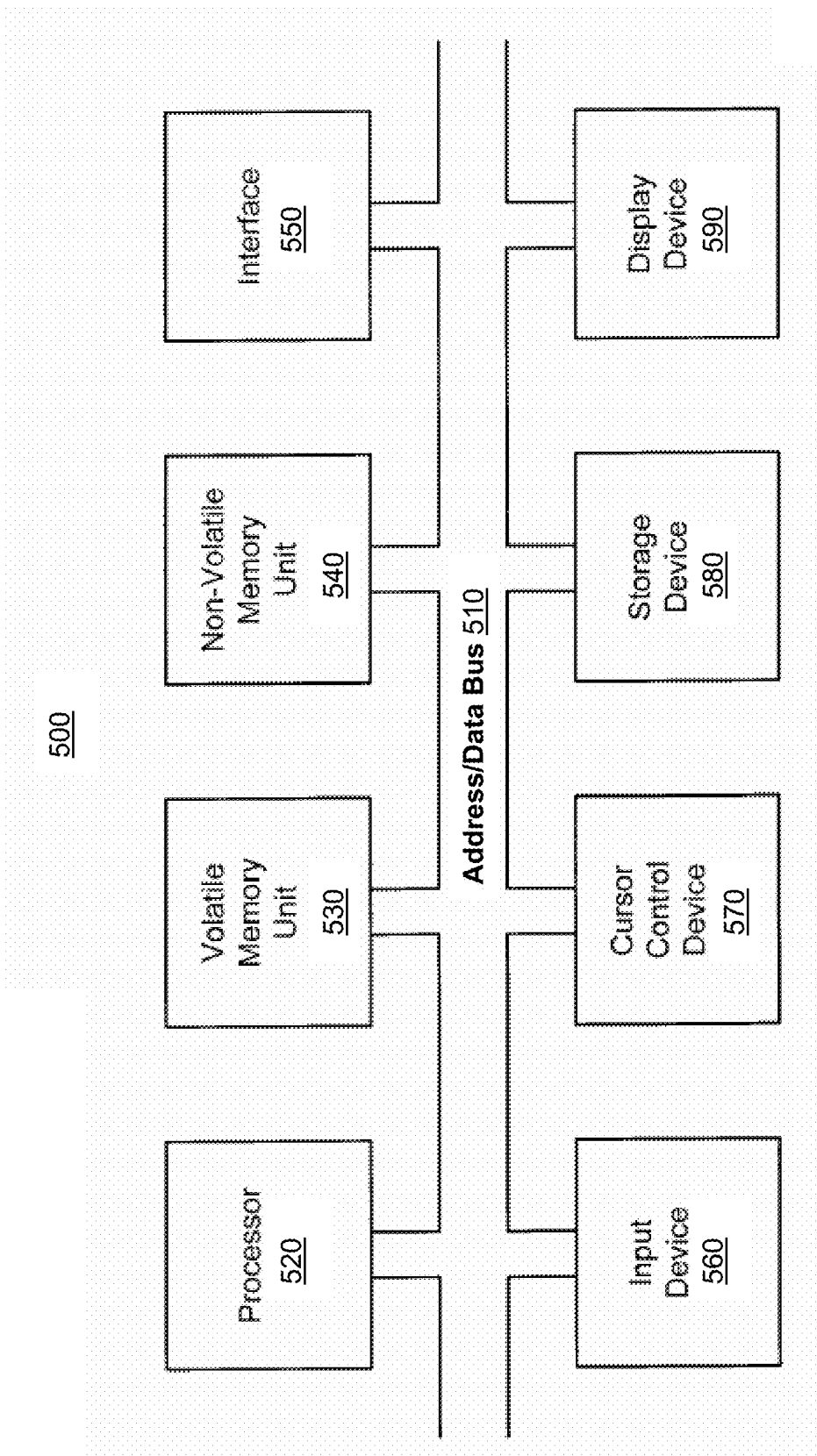
FIG. 5 is an exemplary computer system that may be configured to carry out the method in some embodiments of the invention.

An exemplary computer system 500 in accordance with some embodiments is shown in FIG. 5. Exemplary computer system 500 is configured to perform calculations, processes, operations, and/or functions associated with a program or algorithm. In some embodiments, certain processes and steps discussed herein are realized as a series of instructions (e.g., software program) that reside within computer-readable memory units and are executed by one or more processors of exemplary computer system 500. When executed, the instructions cause exemplary computer system 500 to perform specific actions and exhibit specific behavior, such as described herein.

Exemplary computer system 500 may include an address/data bus 510 that is configured to communicate information. Additionally, one or more data processing units, such as processor 520, are coupled with address/data bus 510. Processor 520 is configured to process information and instructions. In some embodiments, processor 520 is a microprocessor. Alternatively, processor 520 may be a different type of processor such as a parallel processor, or a field-programmable gate array.

Exemplary computer system 500 is configured to utilize one or more data-storage units. Exemplary computer system 500 may include a volatile memory unit 530, such as (but not limited to) random access memory ("RAM"), static RAM, or dynamic RAM, etc.) coupled with address/data bus 510, wherein volatile memory unit 530 is configured to store information and instructions for processor 520. Exemplary computer system 500 further may include a non-volatile memory unit 540, such as (but not limited to) read-only memory ("ROM"), programmable ROM ("PROM"), erasable programmable ROM ("EPROM"), electrically erasable programmable ROM "EEPROM"), or flash memory coupled with address/data bus 510, wherein non-volatile memory unit 540 is configured to store static information and instructions for processor 520. Alternatively exemplary computer system 500 may execute instructions retrieved from an online data-storage unit such as in "cloud computing."

In some embodiments, exemplary computer system 500 also may include one or more interfaces, such as interface 550, coupled with address/data bus 510. The one or more interfaces are configured to enable exemplary computer system 500 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In some embodiments, exemplar computer system 500 may include an input device 560 coupled with address/data bus 510, wherein input device 560 is configured to communicate information and command selections to processor 520. In accordance with certain embodiments, input device 560 is an alphanumeric input device, such as a keyboard, that may include alphanumeric and/or function keys. Alternatively, input device 560 may be an input device other than an alphanumeric input device. In some embodiments, exemplar computer system 500 may include a cursor control device 570 coupled with address/data bus 510, wherein cursor control device 570 is configured to communicate user input information and/or command selections to processor 520. A cursor control device 570 may be implemented using a device such as a mouse, a track-ball, a track-pad, an optical tracking device, or a touch screen. A cursor control device 570 may alternatively, or additionally, be directed and/or activated via input from input device 560, such as in response to the use of special keys and key sequence commands associated with input device 560. Alternatively, or additionally, cursor control device 570 may be configured to be directed or guided by voice commands.

In some embodiments, exemplary computer system 500 further may include one or more optional computer-usable data-storage devices, such as storage device 580, coupled with address/data bus 510. Storage device 580 is configured to store information and/or computer-executable instructions. In some embodiments, storage device 580 is a storage device such as a magnetic or optical disk drive, including for example a hard disk drive ("HDD"), floppy diskette, compact disk read-only memory ("CD-ROM"), or digital versatile disk ("DVD"). In some embodiments, a display device 590 is coupled with address/data bus 510, wherein display device 590 is configured to display video and/or graphics. Display device 590 may include a cathode ray tube ("CRT"), liquid crystal display ("LCD"), field emission display ("FED"), plasma display or any other display device suitable for displaying video and/or graphic images and alphanumeric characters recognizable to a user.

Exemplary computer system 500 is presented herein as an exemplary computing environment in accordance with some embodiments. However, exemplary computer system 500 is not strictly limited to being a computer system. For example, exemplary computer system 500 may represent a type of data processing analysis that may be used in accordance with various embodiments described herein. Moreover, other computing systems may also be implemented. Indeed, the spirit and scope of the present technology is not limited to any single data processing environment. Thus, in some embodiments, one or more operations of various embodiments are controlled or implemented using computer-executable instructions, such as program modules, being executed by a computer. Such program modules may include routines, programs, objects, components and/or data structures that are configured to perform particular tasks or implement particular abstract data types. In addition, in some embodiments, one or more aspects are implemented by utilizing distributed computing environments, such as where tasks are performed by remote processing devices that are linked through a communications network, or such as where various program modules are located in both local and remote computer-storage media including memory-storage devices.

EXAMPLES OF SOME EMBODIMENTS

In order to examine the regression accuracy of impulse-response algorithms according to some embodiments, we feed algorithms with V(t) and I(t) data resulting from various linear resistor-capacitor ("RC") circuits, which are exemplary and not intended to limit the scope of this invention. Other circuit models may be used.

The procedure for the examination is as follows. First, values are prescribed for model parameters of a selected RC circuit. Next, based on inputs of I(t), V(t) inputs are calculated with the ideal circuit model, and the I(t) and V(t) are employed for real-time regression. The effectiveness of an algorithm may be assessed by comparing the regressed parameter values to the prescribed values.

Example 1: Linear One-RC Model Simulations

Figure 2:
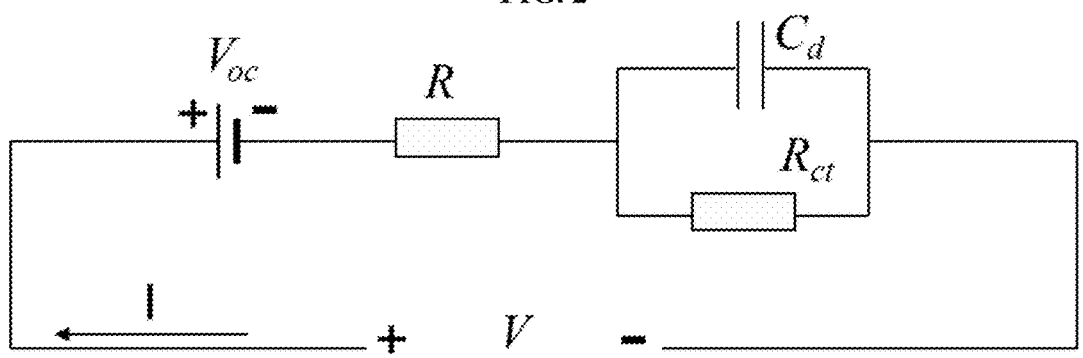
FIG. 2 is a schematic of a one-RC circuit model for an electrochemical system, in some embodiments.
Figure 6:
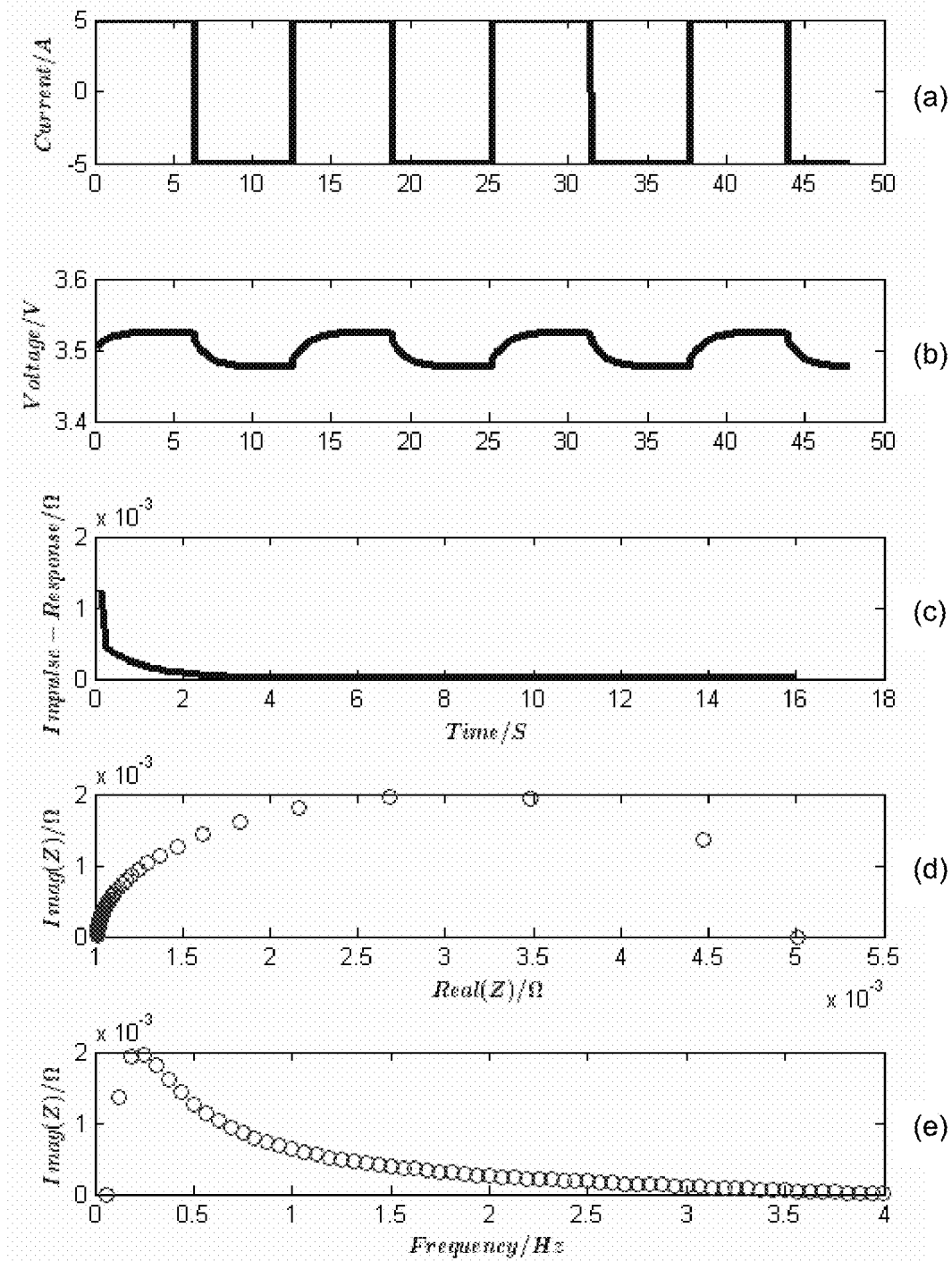
FIG. 6 summarizes the battery simulation results of Example 1, including the driving profiles of current and voltage in graphs 5(a) and 5(b), respectively; the regressed impulse response in graph 5(c); the Nyquist plot in graph 5(d); and the imaginary part of impedance as a function of frequency in graph 5(e).

As one example of the simulation tests, a linear one-RC circuit model, as shown in FIG. 2, is used to generate simulated V(t) and I(t) data. The circuit parameters are prescribed as follows: circuit resistance R=0.001Ω; charge-transfer resistance $R_{ct}$=0.004Ω; diffusion capacitance $C_d$=250 F; and open-circuit voltage $V_{oc}$=3.5 V. The current data I(t) are square waves with a frequency of 0.08 Hz and amplitude of 5 A. The sampling interval is 125 msec. Using the current data I(t) and the selected parameters, voltage data V(t) are calculated. As shown in FIG. 6, the I(t) data are simulated square waves, and the V(t) data are the output from the one-RC circuit with the prescribed parameter values.

Next, I and V data are input into the impulse-response-based algorithm to obtain the impulse response. In the algorithm, we define M=256 and N=128 (see EQ. 4). Equivalently, we sample M+N=384 times of I and V to derive H, which is expected to be finite and decay to zero within a period of $T_0$=N·T=16 seconds.

FIG. 6 depicts (a) the I data and (b) the V data as the driving profile of current and voltage, respectively, used for regression; (c) the derived (regressed) impulse response H(t); (d) the Nyquist plot Z(f) which is the Fourier transform of H(t), where the real part of impedance Z is plotted on the x-axis and the imaginary part of Z is plotted on the y-axis; and (e) the imaginary part of impedance Z versus frequency f.

As shown in the H(t) data of FIG. 6, the impulse response is finite and decays to zero after about 2 seconds. This result is reasonable, since in the one-RC circuit setup, the characteristic time constant is $R_{ct}C_d$=1 second. From the impedance curve of Z(f), FIG. 6(d), on the horizontal axis where the imaginary part of Z is zero, the first resistance value $10^{-3}$Ω corresponds to the predetermined R, and the second resistance value $5 \times 10^{-3}$Ω (where the imaginary part of Z returns to zero) corresponds to the predetermined R+$R_d$. The deduced R and $R_{ct}$ values agree with the predetermined values. For the one-RC circuit, it is known that the radian-frequency equals $1/(R_{ct}C_d)$ at which the amplitude of the imaginary part of Z is at its maximum. From the frequency readout (FIG. 6(e)), $C_d$ is derived to be approximately 262 F, which is about 5% off from the predetermined value. The error is mainly due to the fact that there are not enough low-frequency input data for more accurate estimation.

Example 2: One-RC Simulations Using Real-Time Battery Current Data

In order to demonstrate the capability of the impulse-response-based algorithm to characterize an electrochemical system with measured real-time data, current data as measured from a battery driven in a simulated environment is used to generate voltage data V(t) according to the one-RC circuit model that is similar to the model in Example 1. The one-RC circuit parameters are prescribed as follows: circuit resistance R=0.001Ω; charge-transfer resistance $R_{ct}$=0.004Ω; diffusion capacitance $C_d$=250 F; and open-circuit voltage $V_{oc}$=3.5 V.

Figure 7:
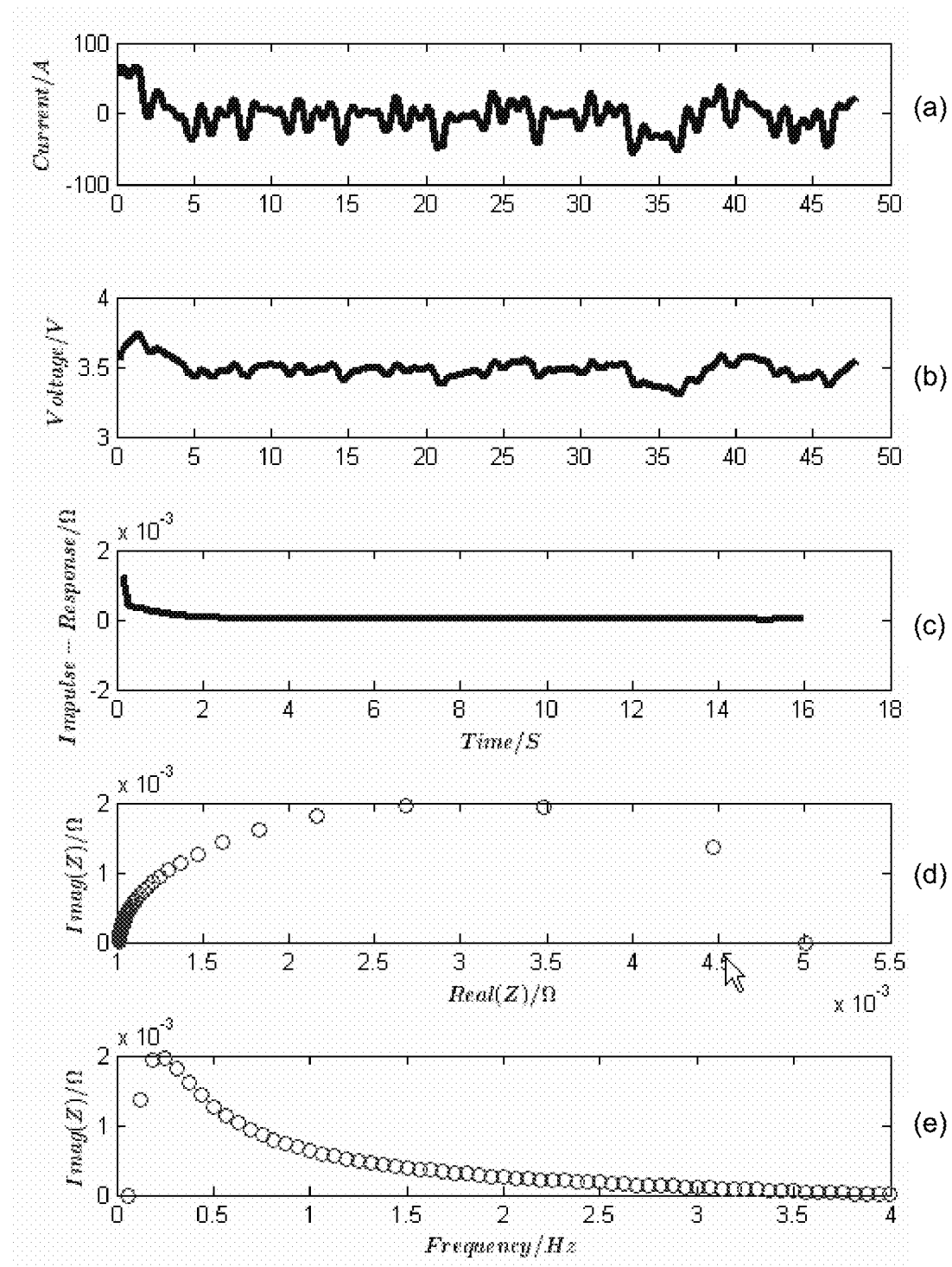
FIG. 7 summarizes the battery simulation results of Example 2, including the driving profiles of current and voltage in graphs 6(a) and 6(b), respectively; the regressed impulse response in graph 6(c); the Nyquist plot in graph 6(d); and the imaginary part of impedance as a function of frequency in graph 6(e).

FIG. 7 shows the simulation results in the same format as FIG. 6. FIGS. 7(a) and 7(b) show the driving profiles of current and voltage, respectively. The current data are the measured battery data, while the voltage data are outputs from the one-RC circuit with the prescribed parameter values above. FIG. 7(c) depicts the regressed impulse response H(t). The Nyquist plot, the Fourier transform of H(t), is shown in FIG. 7(d). The imaginary part of impedance Z as a function of frequency f is shown in FIG. 7(e).

By comparing FIG. 7 with FIG. 6, the deduced results are almost identical even when the driving profiles of V(t) and I(t) are different. The predicted values all agree with the predetermined values. An electrochemical system with measured real-time data can be characterized effectively.

Example 3: Linear Two-RC Model Simulations

Figure 3:
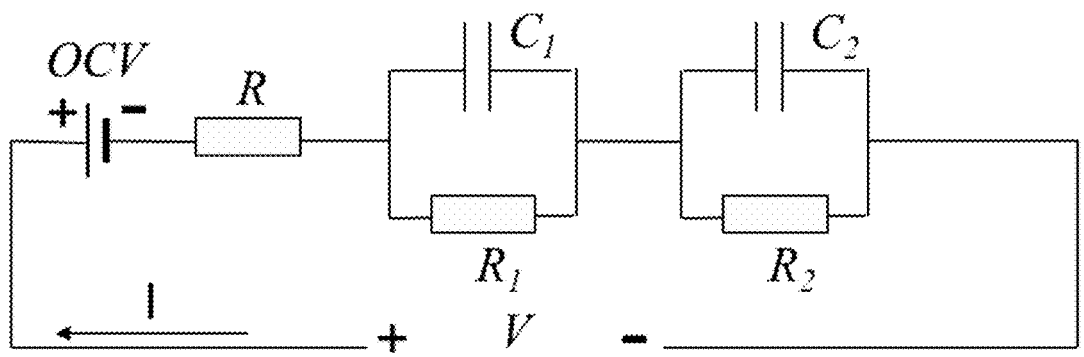
FIG. 3 is a schematic of a two-RC circuit model for an electrochemical system, in some embodiments.

In order to demonstrate the versatility of the impulse-response-based algorithm in some embodiments for different kinds of linear systems, a linear two-RC circuit model, as shown in FIG. 3, is used to generate simulated V(t) and I(t) data. The circuit parameters for the two-RC circuit are prescribed as: circuit resistance R=0.001Ω; first charge-transfer resistance $R_1$=0.0012Ω; first diffusion capacitance $C_1$=500 F; second charge-transfer resistance $R_2$=0.003Ω; second diffusion capacitance $C_2$=3300 F; and open-circuit voltage $V_{oc}$=3.5 V.

Figure 8:
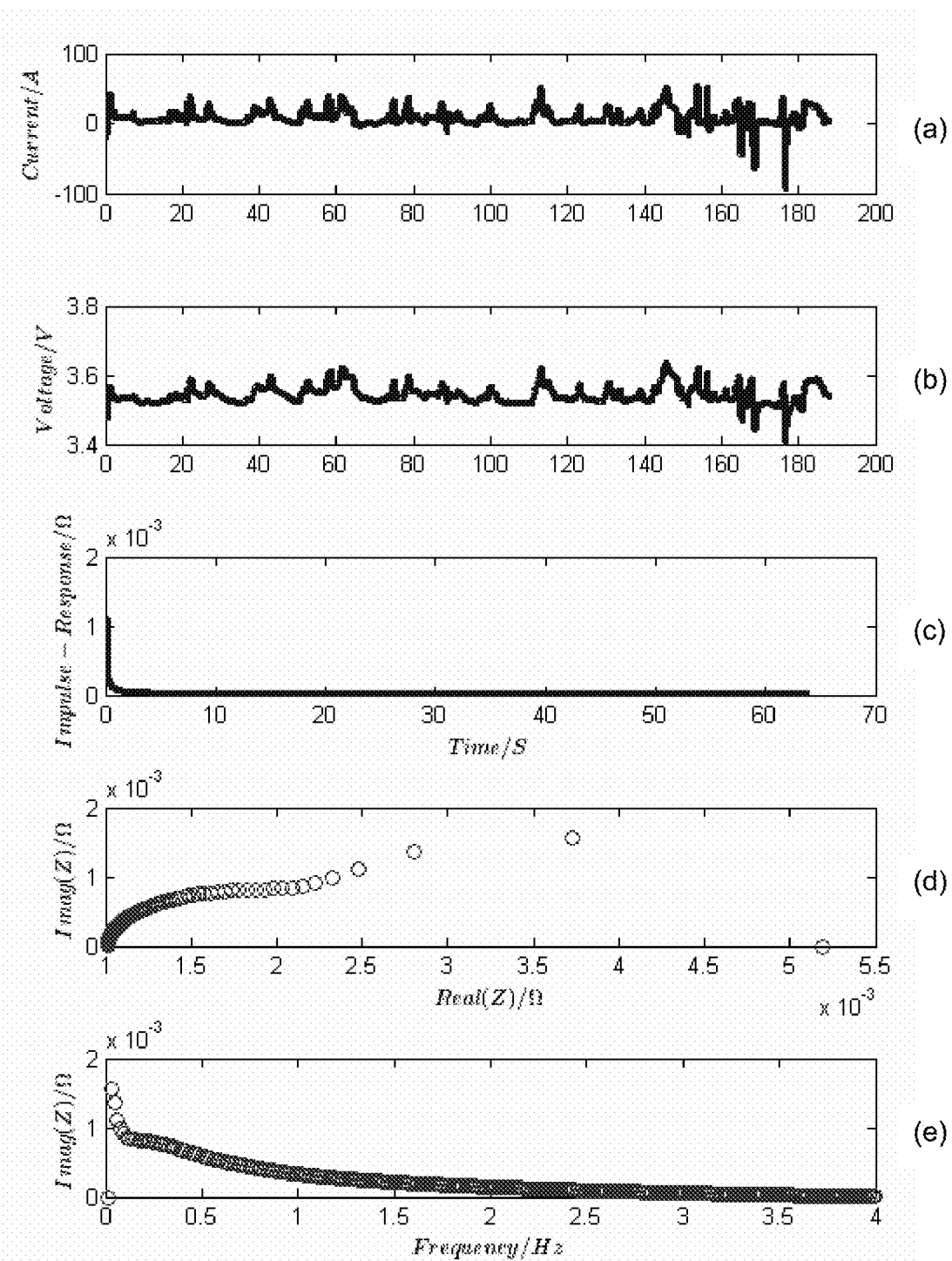
FIG. 8 summarizes the battery simulation results of Example 3, including the driving profiles of current and voltage in graphs 7(a) and 7(b), respectively; the regressed impulse response in graph 7(c); the Nyquist plot in graph 7(d); and the imaginary part of impedance as a function of frequency in graph 7(e).

We use the current data that are measured from a real-time battery driven in a simulated environment to generate voltage data V(t) with the above-defined two-RC circuit. FIG. 8 demonstrates the I and V data used for regression, the derived impulse response H(t), and consequently, the Nyquist plot Z(f) which is the Fourier transform of H(t), and imaginary part of Z verse frequency.

FIG. 8 shows the simulation results. FIGS. 8(a) and 8(b) show the driving profiles of current and voltage, respectively. The current data are the measured battery data, while the voltage data are outputs from the two-RC circuit with the prescribed parameter values for this Example 3. FIG. 8(c) depicts the regressed impulse response H(t). The Nyquist plot, the Fourier transform of H(t), is shown in FIG. 8(d). The imaginary part of impedance Z as a function of frequency f is shown in FIG. 8(e).

We can derive two-RC parameters, similar to the description in the 1-RC discussion. As shown in the H(t) data of FIG. 7, the impulse response is finite and decays to zero after about 2 seconds. From the impedance curve of Z(f), FIG. 8(d), on the horizontal axis where the imaginary part of Z is zero, the first resistance value $10^{-3}$Ω corresponds to the predetermined R, and the second resistance value 5.2×$10^{-3}$Ω (where the imaginary part of Z returns to zero) corresponds to the predetermined $R+R_1+R_2$. The derived parameter values agree well with the respective prescribed values, demonstrating the capability of the algorithm for two-RC circuits.

Example 4: Linear Two-RC Model Simulations for a Time Window

Figure 9:
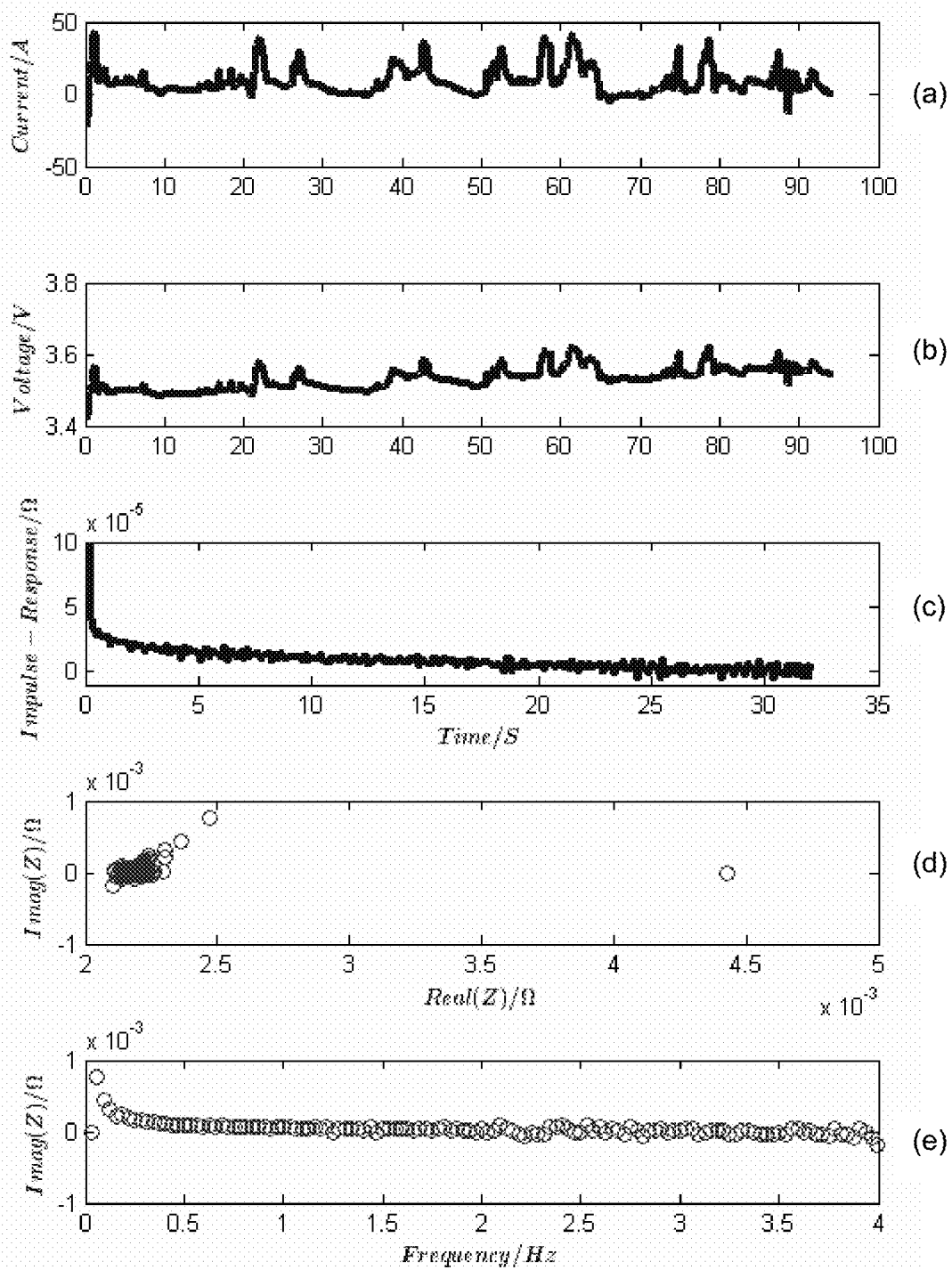
FIG. 9 summarizes the battery simulation results of Example 4, including the driving profiles of current and voltage in graphs 8(a) and 8(b), respectively; the regressed impulse response in graph 8(c); the Nyquist plot in graph 8(d); and the imaginary part of impedance as a function of frequency in graph 8(e).

Measured I, V data are sampled from a selected time window with respect to the data in FIG. 8. FIG. 9 highlights the simulation results with the measured I, V data. FIGS. 9(a) and 9(b) show the measured profiles of current and voltage, respectively, in the time window. FIG. 9(c) depicts the regressed impulse response H(t). The Nyquist plot, the Fourier transform of H(t), is shown in FIG. 9(d). The imaginary part of impedance Z as a function of frequency f is shown in FIG. 9(e).

In the impulse-response-based algorithm for this Example 4, we define M=256 and N=128 (see EQ. 4). Equivalently, we sample M+N=756 times of I and V to derive H, with the sampling interval T of 0.125 seconds. The length of time window is thus about 95 seconds. The length of the impulse response H is limited to $T_0$=N·T=32 seconds. As is shown in FIG. 9(c), the impulse response has a spike at the beginning, whose peak value corresponds to the fast-frequency resistance in the battery. The impulse response decays to non-zero values up to 20 seconds. The Nyquist plot (FIG. 9(d)) of the impedance Z implies a depressed semi-circle. In FIG. 9(e), the plot of the imaginary part of impedance verse frequency is very similar to the curve acquired from the one-RC circuit (Example 2), verifying that the underlying kinetics of this battery can be effectively simulated with a one-RC circuit model.

There are a wide variety of practical and commercial uses for the present invention. Applications of the algorithms in diagnosing electrochemical systems include, but are not limited to, battery diagnostics for in-flight batteries on satellites, aircraft, or other aviation vehicles; real-time management of traction batteries for electric vehicles or hybrid-electric vehicles; battery-pack management for soldier power and ground vehicles; fuel cell diagnostics for personal devices, vehicles, stationary fuel cells; and in situ monitoring of corrosion in structural applications, to name a few.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A method for dynamic characterization of an electrochemical system, said method comprising:
  (a) selecting an electrochemical system to be characterized at a plurality of times within a selected sampling window, wherein said electrochemical system utilizes electrochemical reactions to provide, use, or store electrical energy, and wherein said electrochemical system is selected from the group consisting of a battery, a fuel cell, a capacitor, an electroplating system, and a galvanic corrosion system;
  (b) providing a computer in operable communication with said electrochemical system;

(c) sensing, in said computer, a plurality of first data inputs each comprising measured current to or from said electrochemical system at said plurality of times;
(d) sensing, in said computer, a plurality of second data inputs each comprising measured voltage across said electrochemical system at said plurality of times;
(e) receiving, in said computer, a plurality of third data inputs each comprising the time derivative of said measured current at said plurality of times;
(f) receiving, in said computer, a plurality of fourth data inputs each comprising the time derivative of said measured voltage at said plurality of times; and
(g) calculating an impulse response from said first, second, third, and fourth data inputs using a recursive or matrix-based algorithm, performed in said computer, wherein said impulse response characterizes said electrochemical system within said sampling window.

2. The method of claim 1, wherein step (e) includes approximating said time derivative of said measured current using a difference of said first data input at two different times.

3. The method of claim 1, wherein step (f) includes approximating said time derivative of said measured voltage using a difference of said second data input at two different times.

4. The method of claim 1, wherein steps (e) and (f) collectively accomplish high-frequency pass filtering to filter out static noises associated with said first and second data inputs.

5. The method of claim 1, wherein step (g) comprises solving a least-squares matrix-based equation to determine said impulse response.

6. The method of claim 1, wherein step (g) comprises solving a recursive least-squares equation to determine said impulse response.

7. The method of claim 1, said method comprising adjusting said sampling window and/or duration of said impulse response, to improve stability of said method.

8. The method of claim 1, said method comprising adjusting said sampling window and/or duration of said impulse response, to accommodate kinetics associated with said electrochemical system.

9. The method of claim 1, said method further comprising the step of calculating the Fourier transform of said impulse response to obtain at least one electrochemical system state, within said sampling window.

10. The method of claim 9, wherein said electrochemical system is a battery and wherein said at least one electrochemical system state is selected from the group consisting of battery state-of-health, battery state-of-charge, and battery state-of-power.

11. A method for dynamic characterization of an electrochemical system, said method comprising:
(a) selecting an electrochemical system to be characterized at a plurality of times within a selected sampling window;
(b) providing a current sensor, a voltage sensor, and a computer in operable communication with said electrochemical system, wherein said current sensor is disposed in electrical communication with said computer, and wherein said voltage sensor is disposed in electrical communication with said computer;
(c) sensing, in said current sensor, a plurality of first data inputs each comprising measured current to or from said electrochemical system at said plurality of times;
(d) sensing, in said voltage sensor, a plurality of second data inputs each comprising measured voltage across said electrochemical system at said plurality of times;
(e) receiving, in said computer, a plurality of third data inputs each comprising the time derivative of said measured current at said plurality of times;
(f) receiving, in said computer, a plurality of fourth data inputs each comprising the time derivative of said measured voltage at said plurality of times; and
(g) calculating an impulse response from said first, second, third, and fourth data inputs using a recursive or matrix-based algorithm, performed in said computer, wherein said impulse response characterizes said electrochemical system within said sampling window.

12. The method of claim 11, wherein step (e) includes approximating said time derivative of said measured current using a difference of said first data input at two different times.

13. The method of claim 11, wherein step (f) includes approximating said time derivative of said measured voltage using a difference of said second data input at two different times.

14. The method of claim 11, wherein steps (e) and (f) collectively accomplish high-frequency pass filtering to filter out static noises associated with said first and second data inputs.

15. The method of claim 11, wherein step (g) comprises solving a least-squares matrix-based equation to determine said impulse response.

16. The method of claim 11, wherein step (g) comprises solving a recursive least-squares equation to determine said impulse response.

17. The method of claim 11, said method comprising adjusting said sampling window and/or duration of said impulse response, to improve stability of said method.

18. The method of claim 11, said method comprising adjusting said sampling window and/or duration of said impulse response, to accommodate kinetics associated with said electrochemical system.

19. The method of claim 11, said method further comprising the step of calculating the Fourier transform of said impulse response to obtain at least one electrochemical system state, within said sampling window.

* * * * *